(12) United States Patent
Ha et al.

(10) Patent No.: US 9,782,940 B2
(45) Date of Patent: Oct. 10, 2017

(54) METHOD FOR MANUFACTURING A THREE DIMENSIONAL STRETCHABLE ELECTRONIC DEVICE

(71) Applicant: Korea University Research and Business Foundation, Seoul (KR)

(72) Inventors: Jeong Sook Ha, Seoul (KR); Jangyeol Yoon, Seoul (KR); Yein Lim, Seoul (KR); Sooyeong Hong, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 147 days.

(21) Appl. No.: 14/596,073

(22) Filed: Jan. 13, 2015

(65) Prior Publication Data
US 2015/0131239 A1    May 14, 2015

Related U.S. Application Data

(63) Continuation of application No. PCT/KR2014/000174, filed on Jan. 8, 2014.

(30) Foreign Application Priority Data

Oct. 17, 2013  (KR) .......................... 10-2013-0124090

(51) Int. Cl.
*B29C 70/88* (2006.01)
*H05K 1/02* (2006.01)
(Continued)

(52) U.S. Cl.
CPC .............. *B29C 70/88* (2013.01); *B29C 70/72* (2013.01); *B29C 70/885* (2013.01);
(Continued)

(58) Field of Classification Search
CPC ....... B29C 70/88; B29C 70/72; B29C 70/885; H05K 1/0271; H05K 1/0272;
(Continued)

(56) References Cited

U.S. PATENT DOCUMENTS 3,838,204 A * 9/1974 Ahn ........................ H01L 49/02
174/257
5,163,499 A * 11/1992 Newkirk ............... C04B 35/652
164/108
(Continued)

FOREIGN PATENT DOCUMENTS

JP    2001-320150    * 11/2001    ............... H05K 3/00
JP    2001-320150 A    11/2001
(Continued)

Primary Examiner — Peter DungBa Vo
Assistant Examiner — Jeffrey T Carley
(74) Attorney, Agent, or Firm — Mintz Levin Cohn Ferris Glovsky and Popeo, P.C.; Kongsik Kim; Jonathon Western

(57) ABSTRACT

A manufacturing method of a three-dimensional stretchable electronic device includes: preparing an aluminum mold for producing a substrate having one or more protrusions on an upper side and a lower side thereof; forming a path for a connection line for connecting the protrusions of the substrate using a wire; introducing a first polymer for forming the protrusions of the substrate into a predetermined portion of the aluminum mold; removing the wire and the three-dimensional stretchable substrate from the aluminum mold; injecting a liquid metal into the path for a connection line from which the wire was removed, thus manufacturing a three-dimensional stretchable substrate having a connection line; and transferring elements to the protrusions of the three-dimensional stretchable substrate having the connection line and connecting the elements to the connection line, thus connecting the elements to each other.

7 Claims, 3 Drawing Sheets

(51) Int. Cl.
    *H05K 1/09*     (2006.01)
    *H05K 3/00*     (2006.01)
    *H05K 3/10*     (2006.01)
    *B29C 70/72*     (2006.01)
    *H05K 1/03*     (2006.01)

(52) U.S. Cl.
    CPC ......... *H05K 1/0272* (2013.01); *H05K 1/0283* (2013.01); *H05K 1/036* (2013.01); *H05K 1/092* (2013.01); *H05K 3/0014* (2013.01); *H05K 3/107* (2013.01); *H05K 1/0284* (2013.01); *H05K 1/034* (2013.01); *H05K 2201/015* (2013.01); *H05K 2201/09036* (2013.01); *H05K 2201/09118* (2013.01); *H05K 2203/128* (2013.01)

(58) Field of Classification Search
    CPC ...... H05K 1/0283; H05K 1/092; H05K 1/036; H05K 3/0014; H05K 3/107
    See application file for complete search history.

(56) References Cited

U.S. PATENT DOCUMENTS

| | | | | |
|---|---|---|---|---|
| 2002/0026980 | A1* | 3/2002 | Nakatani | ................. B32B 15/08 |
| | | | | 156/252 |
| 2009/0117401 | A1* | 5/2009 | Naritomi | ................. B29C 45/14 |
| | | | | 428/545 |
| 2009/0146114 | A1* | 6/2009 | Toyoda | ................ C09D 11/326 |
| | | | | 252/512 |
| 2010/0238636 | A1* | 9/2010 | Mascaro | .......... B29C 45/14639 |
| | | | | 361/750 |

FOREIGN PATENT DOCUMENTS

| | | |
|---|---|---|
| KR | 10-2007-0093776 A | 9/2007 |
| KR | 10-0827620 B1 | 5/2008 |
| KR | 10-1048356 B1 | 7/2011 |
| KR | 10-1052116 B1 | 7/2011 |
| KR | 10-2013-0076329 A | 7/2013 |

* cited by examiner

METHOD FOR MANUFACTURING A THREE DIMENSIONAL STRETCHABLE ELECTRONIC DEVICE

CROSS-REFERENCE TO RELATED APPLICATIONS

This application is a continuation of International Application No. PCT/KR2014/000174 filed on Jan. 8, 2014, which claims priority to Korean Application No. 10-2013-0124090 filed on Oct. 17, 2013, which applications are incorporated herein by reference.

TECHNICAL FIELD

The present invention relates to a three dimensional stretchable electronic device and a manufacturing method comprising the same.

BACKGROUND ART

Currently, electronic device process techniques are focused on manufacturing flexible or stretchable electronic devices so as to achieve wearable computers. In particular, process techniques for stretchable electronic devices are being ambitiously developed based on the prediction that silicon-based hard electronic devices will be changed in the future into flexible electronic devices that may be utilized in daily lives.

Accordingly, thorough research into advancements in process techniques for stretchable electronic devices is ongoing. Especially, stretchable electronic devices having elements and connection lines in two-dimensional form have been developed, and the structure thereof where strain is intensively applied to the connection lines is in the spotlight. A manufacturing method of a stretchable electronic device includes forming driving elements and electronic elements having connection lines able to absorb strain on an existing hard substrate, and then transferring the electronic elements to a stretchable polymer-based film. The connection lines of the stretchable electronic device thus manufactured have a zigzag structure or a pop-up structure so as to be adapted for two-dimensional stretching, and may thus absorb most strain applied thereto.

However, technical limitations are recently imposed on such process techniques. Existing studies have proposed techniques in which elements and connection lines are two dimensionally integrated on a plane so as to be stretchable. As such, the connection lines covered with only a very thin protective layer may undergo intense strain. Hence, such a two-dimensional stretchable electronic device is very weak to external force, and thereby shorting of the connection lines may easily occur and integration is possible only on a plane, making it difficult to achieve integration in a vertical structure and thus exhibiting a low degree of integration.

SUMMARY OF DISCLOSURE

The present invention has been made keeping in mind the above problems, and an object of the present invention is to provide a manufacturing method of a three-dimensional stretchable electronic device, which may reduce strain applied to a connection line and may protect the connection line from the outside.

Another object of the present invention is to provide a three-dimensional stretchable electronic device, in which elements are transferred to both sides of a substrate to thus increase the degree of integration of the three-dimensional stretchable electronic device.

In order to accomplish the above objects, the present invention provides a manufacturing method of a three-dimensional stretchable electronic device, comprising: (1) preparing an aluminum mold (100) for producing a substrate having one or more protrusions on an upper side and a lower side thereof; (2) forming a path for a connection line for connecting the protrusions of the substrate using a wire (110); (3) introducing a first polymer (120) for forming the protrusions of the substrate into a predetermined portion of the aluminum mold, semi-curing the first polymer, introducing a second polymer (130) into a remaining portion of the aluminum mold, and curing the second polymer, thus forming a three-dimensional stretchable substrate having the wire in the aluminum mold; (4) removing the wire and the three-dimensional stretchable substrate from the aluminum mold; (5) injecting a liquid metal (140) into the path for a connection line from which the wire was removed, thus manufacturing a three-dimensional stretchable substrate having a connection line; and (6) transferring elements (150) to the protrusions of the three-dimensional stretchable substrate having the connection line and connecting the elements to the connection line, thus connecting the to elements to each other.

In addition, the present invention provides a three-dimensional stretchable electronic device manufactured by the manufacturing method as above.

According to the present invention, a three-dimensional stretchable electronic device is configured such that a connection line is positioned in a substrate and thus can be protected from the outside. When a liquid metal is used for the connection line, there are no changes in volume of the connection line upon stretching, so that shorting cannot occur even upon external deformation, making it possible to easily connect the elements to each other.

In addition, elements can be transferred to both sides of the substrate, thus effectively increasing the degree of integration of the three-dimensional stretchable electronic device.

DETAILED DESCRIPTION

Figure 1:
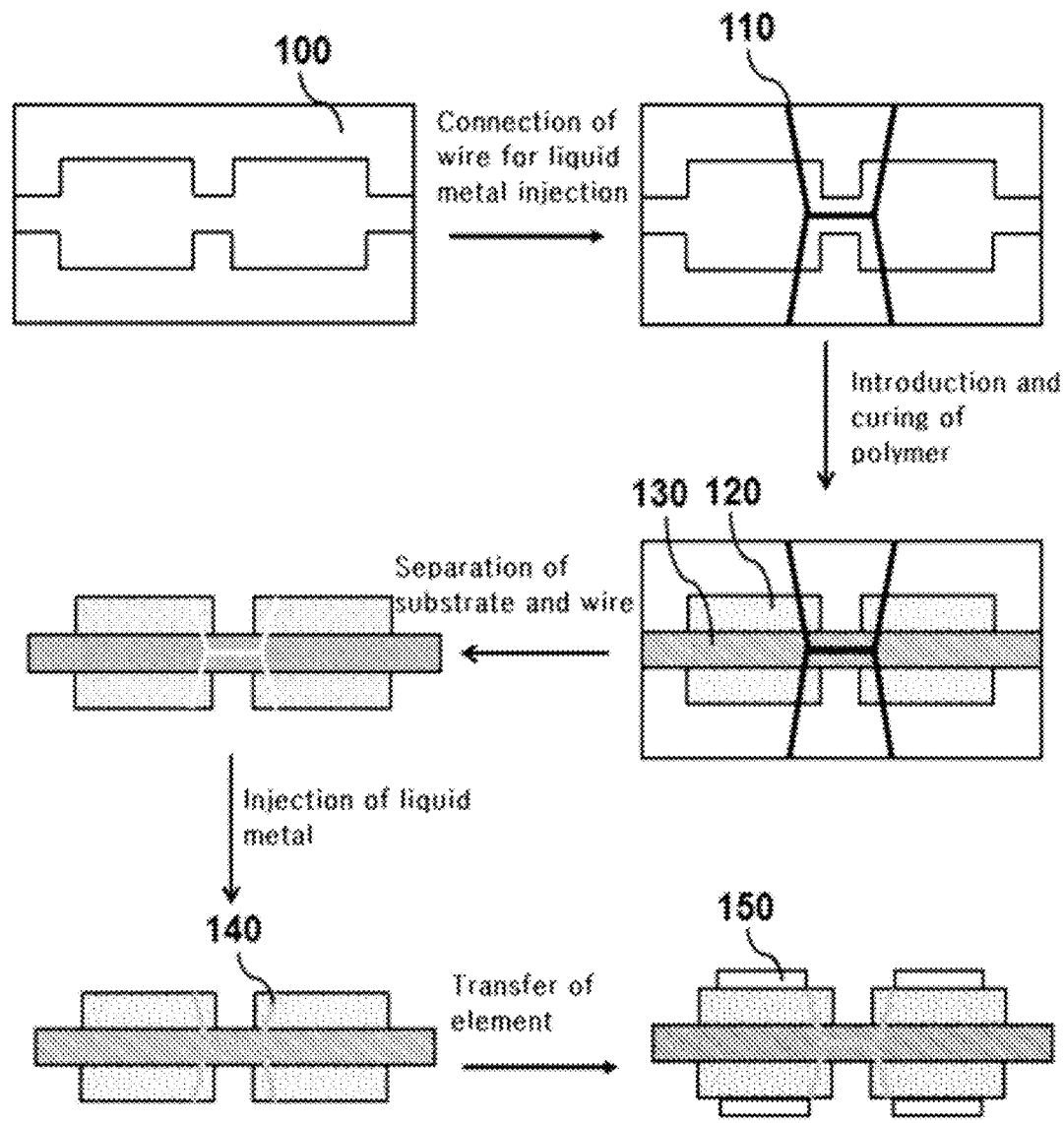
FIG. 1 is a schematic view illustrating a process of manufacturing a three-dimensional stretchable electronic device (100: aluminum mold, 110: wire, 120: first polymer, 130: second polymer, 140: liquid metal, and 150: element)
Figure 2:
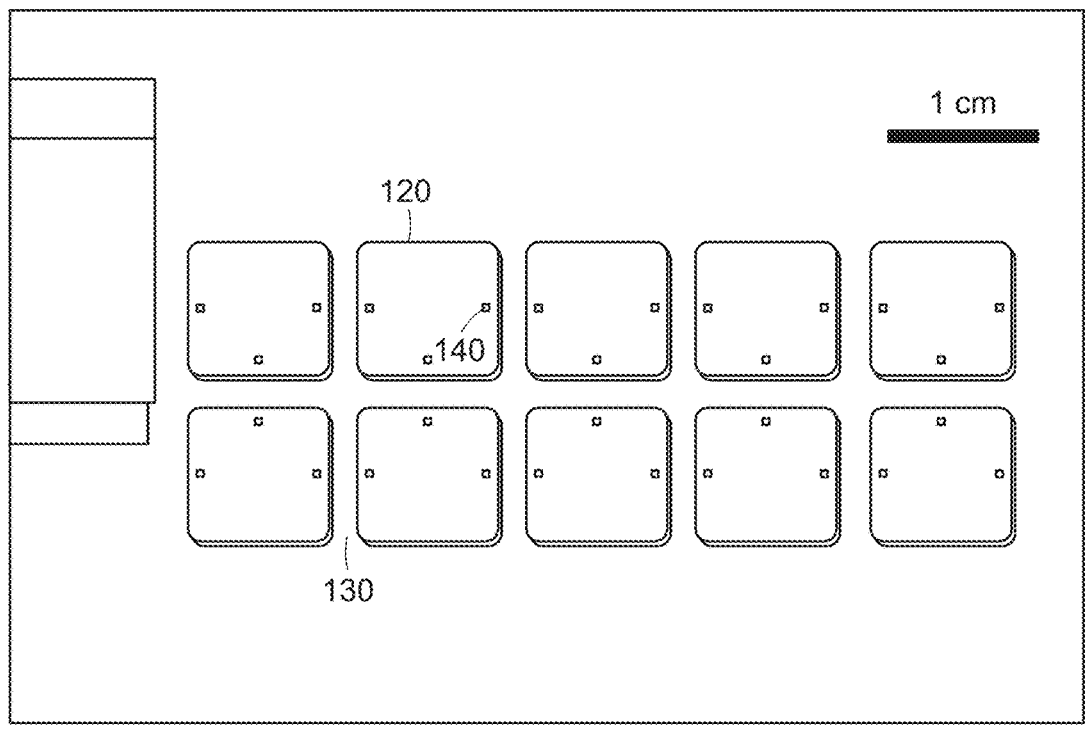
FIG. 2 is an optical image illustrating a three-dimensional stretchable substrate.
Figure 3:
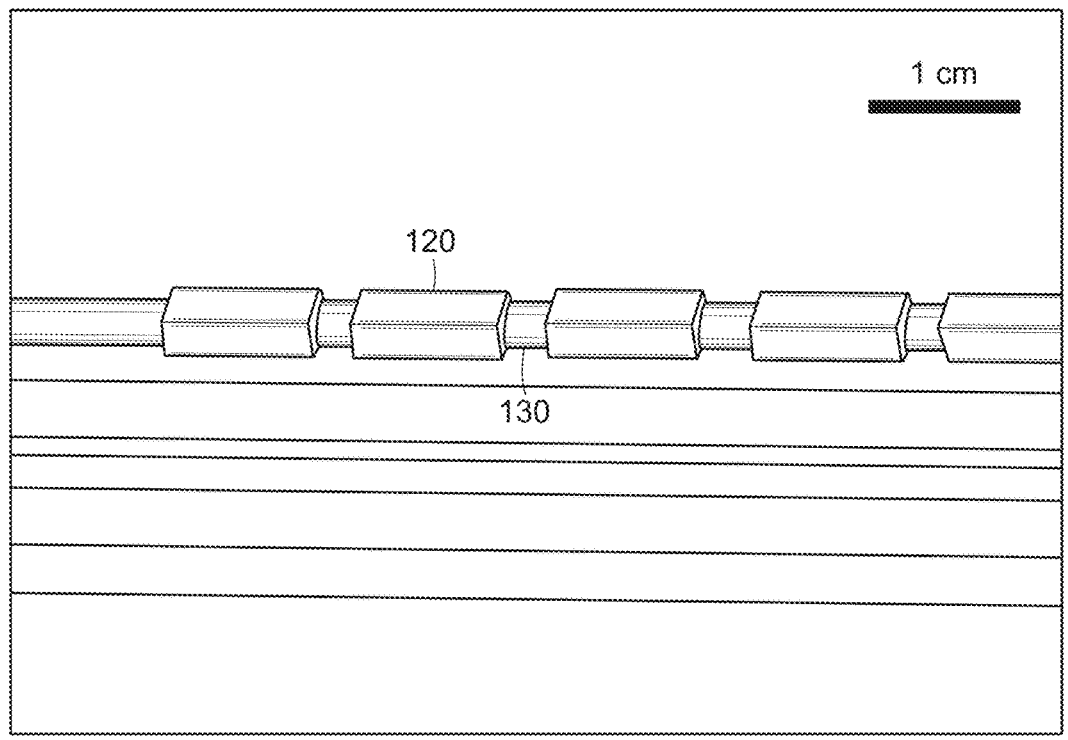
FIG. 3 is an optical image illustrating a lateral side of the three-dimensional stretchable substrate.

Hereinafter, a detailed description will be given of the present invention.

The present invention addresses a manufacturing method of a three-dimensional stretchable electronic device, as described below: (1) preparing an aluminum mold 100 for producing a substrate having one or more protrusions on upper and lower sides thereof; (2) forming a path for a connection line for connecting the protrusions of the substrate using a wire 110; (3) introducing a first polymer 120 for forming the protrusions of the substrate into a predetermined portion of the aluminum mold, semi-curing the first polymer, introducing a second polymer 130 having lower hardness than the first polymer 120 in the remaining portion of the aluminum mold, and curing the second polymer, thus obtaining a three-dimensional stretchable substrate having the wire in the aluminum mold; (4) removing the wire and the three-dimensional stretchable substrate from the aluminum mold; (5) injecting a liquid metal 140 into the path for a connection line from which the wire was removed, thus obtaining a three-dimensional stretchable substrate having a connection line; and (6) transferring elements 150 to the protrusions of the three-dimensional stretchable substrate having the connection line, and connecting the elements to the connection line, thus connecting the elements to each other.

In the present invention, the aluminum mold 100 is employed after coating of the surface thereof with Teflon™ (polytetrafluoroethylene). When the surface of the aluminum mold is coated with Teflon™ in this way, the Step (4) for removing the three-dimensional stretchable substrate made of a polymer from the aluminum mold may be easily performed.

In the Step (2), a wire having a diameter of 200 to 300 μm is inserted into the aluminum mold to make a path for a connection line capable of connecting elements, after which a liquid metal 140 is injected into a space formed by removing the wire, thus forming the connection line.

In the Step (3), the first polymer 120 and the second polymer 130, which are introduced into the aluminum mold 100, may include one or more selected from the group consisting of PDMS (polydimethyl siloxane), a rubber made of platinum-catalyzed silicon (e.g., Ecoflex®), PVA (poly vinyl alcohol) and a silicon rubber (e.g., Dragon Skin® 10 SLOW). The first polymer 120 introduced into the recesses of the aluminum mold may be PDMS, and the second polymer 130 introduced into the remaining portion of the aluminum mold may be a mixture of PDMS and Ecoflex® which have lower hardness than the first polymer 120 and may preferably be mixed at a mass ratio of 5:5 to 2:8. The three-dimensional stretchable substrate may be prepared when the second polymer 130 has lower hardness than the first polymer 120.

Furthermore, in the Step (3), the first polymer 120 is introduced into the recesses of the aluminum mold and then semi-cured, after which the second polymer 130 is introduced into the remaining portion of the aluminum mold and then cured, thus making a three-dimensional stretchable substrate having the wire therein. If the first polymer 120 is not semi-cured, when the second polymer 2 is introduced into the remaining portion of the aluminum mold, it may be mixed with the first polymer that may flow down. Also, to defoam the first and the second polymer before curing of the introduced second polymer, the polymer may be stored in a vacuum and then cured. Even when the polymer is introduced, the wire in the aluminum mold is not deformed.

In the Step (4), the three-dimensional stretchable substrate formed in the aluminum mold is removed from the aluminum mold, after which the wire is removed. In the Step (5), the liquid metal 140 is injected into the path for a connection line produced by removal of the wire, thus manufacturing the three-dimensional stretchable substrate having the connection line.

Since a liquid metal such as EGaIn or EGaInSn is used for the connection line in the present invention, the connection line is not changed in volume even upon stretching the substrate, and may connect the elements even upon external deformation. Also, since the connection line is positioned in the substrate, the connection line may be safely protected from the external environment.

In the Step (6), the elements 150 are transferred to the protrusions of the three-dimensional stretchable substrate, and then connected to the connection line, finally manufacturing a three-dimensional stretchable electronic device. As such, the elements may be transferred to both sides of the three-dimensional stretchable substrate, so that the three-dimensional stretchable electronic device according to the present invention may exhibit a high degree of integration, compared to existing electronic devices.

In addition, the present invention addresses a three-dimensional stretchable electronic device manufactured by the above manufacturing method. The three-dimensional stretchable electronic device enables connection of the elements to each other without shorting even upon external deformation, and thus may be applied to a variety of fields including wearable computers or stretchable devices.

A better understanding of the present invention may be obtained through the following example and test example which are set forth to illustrate, but are not to be construed as limiting the scope of the present invention.

Example 1. Manufacture of Three-Dimensional Stretchable Electronic Device

An aluminum mold, the surface of which had been coated with Teflon™ was connected with a wire having a diameter of 300 .mu.m, thus making a path for a connection line. Subsequently, PDMS was introduced into the inner recesses of the aluminum mold having the wire therein and then semi-cured in a dry oven at 65.degree. C. for 13 min. Subsequently, a mixture of PDMS and Ecoflex® at a mass ratio of 2:8 was introduced into the remaining portion of the aluminum mold, stored in a vacuum for 30 min so as to be defoamed, and then cured in a dry oven at 65.degree. C. for 1 hr 20 min, thus manufacturing a three-dimensional stretchable substrate having the wire therein.

Thereafter, the cured three-dimensional stretchable substrate was removed from the aluminum mold, the wire was removed, and a liquid metal (EGaIn) was injected into an empty space formed by removal of the wire, thus forming a connection line.

Thereafter, elements were transferred to the PDMS protrusions of both sides of the three-dimensional stretchable substrate and then connected to the connection line, thus completing the connection between the elements, ultimately manufacturing a three-dimensional stretchable electronic device.

Test Example 1. Comparison of Resistance of Connection Line Upon Stretching

Figure 5:
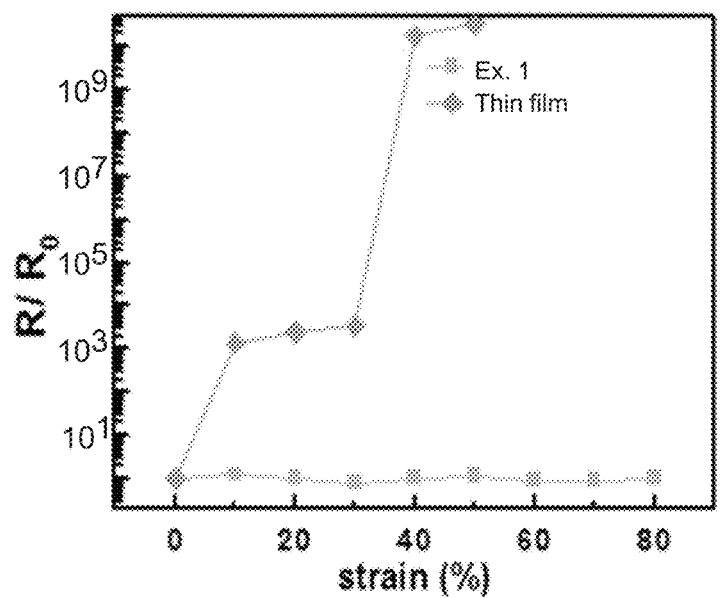
FIG. 5 is a graph illustrating resistance of the connection line upon stretching of the three-dimensional stretchable substrate of Example 1 and the thin film.

The resistance values of the connection line upon stretching of an existing thin film and the three-dimensional stretchable substrate of Example 1 according to the present invention were compared. The results are graphed in FIG. 5.

Figure 4:
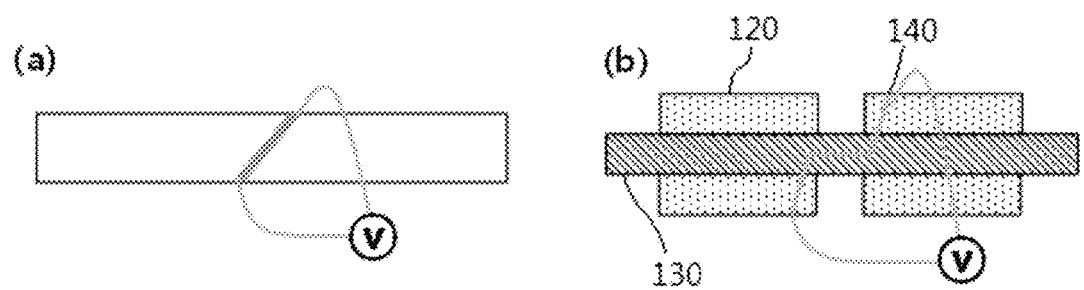
FIG. 4(a) is a view illustrating a thin film having a liquid connection line connected with an additional connection line for measurement of electric power.
FIG. 4(b) is a view illustrating a three-dimensional stretchable substrate having a liquid metal connection line connected with an additional connection line for measurement of electric power.

To compare the resistance values due to stretching, a liquid connection line was introduced into each of the thin film and the three-dimensional stretchable substrate and an additional connection line for measurement of electric power was connected thereto, followed by stretching (FIGS. 4(a) and 4(b)).

When the three-dimensional stretchable substrate of Example 1 was stretched up to 80%, there were no changes in the resistance, and a low resistance value was maintained. However, even when the existing thin film was stretched by 10%, the resistance was drastically increased. This resistance value was maintained up to 30% stretching and then increased about $10^6$ times from 40% stretching.

Although the resistance of the connection line of the existing thin film was remarkably increased upon stretching, the resistance of the three-dimensional stretchable substrate according to the present invention was not increased even upon stretching, and a low resistance value was uniformly maintained. This is considered to be due to the following: upon stretching of the existing thin film, both the liquid connection line and the portion for measurement of electric power are affected and thus the connection may be easily broken; however, upon stretching of the three-dimensional stretchable substrate according to the present invention, the liquid connection line portion may be significantly stretched and also there is almost no deformation in the protrusions, thus preventing shorting between the portion for measurement of electric power and the liquid connection line.

The invention claimed is:

1. A manufacturing method of a three-dimensional stretchable electronic device, comprising:
   (1) preparing an aluminum mold for producing a substrate having one or more protrusions on an upper side and a lower side thereof;
   (2) inserting a wire into the aluminum mold to form a path for a connection line for connecting the protrusions of the substrate using a wire;
   (3) introducing a first polymer for forming the protrusions of the substrate into a predetermined portion of the aluminum mold, semi-curing the first polymer, introducing a second polymer having lower hardness than the first polymer into a remaining portion of the aluminum mold, and curing the second polymer, thus forming a three-dimensional stretchable substrate having the wire in the aluminum mold;
   (4) removing the wire from the path for the connection line formed in the three-dimensional stretchable substrate and the three-dimensional stretchable substrate from the aluminum mold;
   (5) injecting a liquid metal into the path for a connection line from which the wire was removed, thus manufacturing a three-dimensional stretchable substrate having a connection line; and
   (6) transferring elements to the protrusions of the three-dimensional stretchable substrate having the connection line and connecting the elements to the connection line, thus connecting the elements to each other.

2. The manufacturing method of claim 1, wherein a surface of the aluminum mold is coated with Teflon™.

3. The manufacturing method of claim 1, wherein the wire has a diameter of 200 to 300 µm.

4. The manufacturing method of claim 1, wherein the first polymer and the second polymer introduced into the aluminum mold in the Step (2) comprise one or more selected from the group consisting of PDMS (poly-dimethyl siloxane), Ecoflex®, PVA (poly-vinyl alcohol) and Dragon Skin® 10 SLOW.

5. The manufacturing method of claim 4, wherein the first polymer introduced into inner recesses of the aluminum mold is PDMS, and the second polymer introduced into the remaining portion of the aluminum mold is a mixture of PDMS and Ecoflex®.

6. The manufacturing method of claim 5, wherein the mixture of PDMS and Ecoflex® has a mass ratio of 5:5 to 2:8.

7. The manufacturing method of claim 1, wherein in the Step (6), the elements are transferred to both sides of the three-dimensional stretchable substrate.

* * * * *